United States Patent [19]

Kojima

[11] Patent Number: 5,038,786
[45] Date of Patent: Aug. 13, 1991

[54] SPECTROSCOPIC IMAGING APPARATUS CAPABLE OF DISPLAYING PROTON IMAGE

[75] Inventor: Fumitoshi Kojima, Tochigi, Japan

[73] Assignee: Kabushiki Kaisha Toshiba, Kawasaki, Japan

[21] Appl. No.: 337,757

[22] Filed: Apr. 13, 1989

[30] Foreign Application Priority Data

Apr. 15, 1988 [JP] Japan ................. 63-91800

[51] Int. Cl.$^5$ .................................. A61B 5/055
[52] U.S. Cl. .................. 128/653 R; 324/307; 324/312
[58] Field of Search ............. 128/653 R; 324/307, 324/309, 310, 312

[56] References Cited

U.S. PATENT DOCUMENTS

| | | | |
|---|---|---|---|
| Re. 32,689 | 6/1988 | Damadian | 128/653 R |
| 4,065,714 | 12/1977 | Hill | 324/312 |
| 4,644,275 | 2/1987 | Young | 324/307 |
| 4,847,559 | 7/1989 | Keren | 324/307 |
| 4,868,747 | 9/1989 | Mori et al. | 382/6 |
| 4,901,019 | 2/1990 | Wedeen | 324/312 |
| 4,940,055 | 7/1990 | Brown | 128/653 R |

OTHER PUBLICATIONS

"Chemical Shift Imaging", *NMR IGAKU* (Medical Engineering), vol. 6, No. 4, 1984, pp. 221-239.

*Primary Examiner*—Lee S. Cohen
*Assistant Examiner*—K. M. Pfaffle
*Attorney, Agent, or Firm*—Foley & Lardner

[57] ABSTRACT

In a spectroscopic imaging apparatus utilizing the magnetic resonance phenomenon, a spectroscopic image of phosphorus-31 within a slice portion of a biological body under examination is displayed in a materix form. Furthermore, a proton image of the slice portion is displayed in the same matrix form. In addition, a spectroscopic graph for a selected matrix element of the proton image is displayed.

20 Claims, 6 Drawing Sheets

SPECTROSCOPIC IMAGING APPARATUS CAPABLE OF DISPLAYING PROTON IMAGE

BACKGROUND OF THE INVENTION

1. Field of the Invention

The present invention generally relates to a spectroscopic imaging apparatus in which information concerning a distribution condition of an element, e.g., $^{31}P$ and $^{13}C$ within a tissue of a human body is displayed so as to represent, as an image of physiological data, whether or not there is a disease portion therein. More specifically, the present invention is directed to a spectroscopic imaging apparatus capable of displaying an additional image for compensating for unclear physiological information specific to the spectroscopic image.

2. Description of the Related Art

In a spectroscopic imaging apparatus known in the art, various physiological information concerning the presence of a nuclear species, e.g., $^{31}P$ (phosphorus-31), its distribution, or a ratio of this species and a compound within a certain region of an object under examination, i.e., a tissue of a human body, is displayed as a spectroscopic image and a spectroscopic graph.

For instance, 31P(phosphorus-31) is present within a tissue of a biological body in various forms, namely PC$\gamma$ (phosphocreatine), PD(phosphodiester), PM(phosphomonoester), Pi(inograric phosphate), a compound such as $\alpha$ phosphorus nuclei of ATP (adenosinetriphosphate), $\beta$ phosphorus nuclei of ATP, and $\gamma$ phosphorus nuclei of ATP.

When $^{31}P$ is employed as the nuclear species under examination, the spectroscopic image represents how phosphorus-31 is distributed as a whole within a selected tomographic (slice) region of the biological body under examination. Also, the spectroscopic graph represents the presence (abundance) ratio of the above-described various compounds involving $^{31}P$ with respect to a partial region selected from the above slice region based upon a so-called "chemical shift" phenomenon.

Such a spectroscopic imaging apparatus is known from, for instance, "Chemical Shift Imaging" of a monthly magazine "NMR IGAKU (medical engineering)" Vol. 6, No. 4, 1984, on pages 221 to 239. Great developments are very much desired in the spectroscopic imaging apparatus for providing more detailed physiological information of a biological body under examination.

In the above-described conventional spectroscopic imaging apparatus, the matrix element number of the displayed spectroscopic image corresponding to the resolution is not so large, e.g., $4 \times 4$ to $32 \times 32$.

In FIG. 1, for instance, the matrix element number of the spectroscopic image is selected to be $6 \times 6$.

It should be noted that the above-described matrix element number is completely different from a pixel functioning as a basic display unit. In fact, the spectroscopic image "P$_1$" shown in FIG. 1 is displayed in $160 \times 160$ pixel numbers. In other words, one matrix element of the object under examination is displayed by 160/6 pixel elements in an enlarged form. However, the resolution of the pixel-enlarged spectroscopic image "P$_1$" is not changed, i.e., still low.

The reason why the matrix element number of the spectroscopic image is small, is that the signal-to-noise ratio thereof will be lowered if the matrix element number is selected to be large, because an amount of existence of, for instance, $^{31}P$ within the tissue of the biological body is small and thus the signal level of the acquired MR (magnetic resonance) signal is also low.

In addition, the spectroscopic graph "P$_2$", for instance, shown in FIG. 1, represents how the specific nuclear species, e.g., $^{31}P$ is present in the specific compound at the specific presence ratio within a single matrix element constituting the spectroscopic image. A matrix element of the displayed spectroscopic graph is designated by way of a light pen or a ROI (region of interest) mark.

However, in this case, since the image resolution of the spectroscopic image is low, it is very difficult to precisely designate the matrix element to be displayed. For instance, even if an eye portion of a biological body is desired to be displayed as the spectroscopic graph, and thus the matrix element of the spectroscopic image corresponding to the eye portion is designated by the light pen (see element 70 of FIG. 2) it is practically rather difficult to achieve a clear designation of the eye portion in the displayed spectroscopic image.

In other words, even though the detailed information on the presence conditions of the specific species could be obtained, the conventional spectroscopic imaging apparatus would merely disclose a part of the detailed physiological information, namely, the distribution information of the specific species over the entire measurement region.

SUMMARY OF THE INVENTION

The present invention has been made in an attempt to solve the above-described problems of the conventional spectroscopic imaging apparatus, and therefore, was as an object to provide a novel spectroscopic imaging apparatus capable of displaying an additional image for compensating for the low resolution of the conventional spectroscopic image.

A spectroscopic imaging apparatus, according to the present invention, comprises:

means for acquiring spectroscopic imaging data concerning a nuclear species within a tissue of a biological object under medical examination so as to obtain a spectroscopic image;

means for acquiring spectroscopic graphic data concerning a ratio of the nuclear species to a compound present in a selected portion of the tissue;

means for acquiring auxiliary image data relating to the spectroscopic imaging data in order to obtain an auxiliary image; and, means for displaying the spectroscopic image and auxiliary image in a same matrix form, and for displaying a spectroscopic graph based upon the spectroscopic graphic data.

BRIEF DESCRIPTION OF THE DRAWINGS

For a better understanding of the present invention, reference is made to the following description in conjunction with the accompanying drawings, in which.

DETAILED DESCRIPTION OF THE PREFERRED EMBODIMENTS

Arrangement of First Spectroscopic Imaging Apparatus

Figure 1:
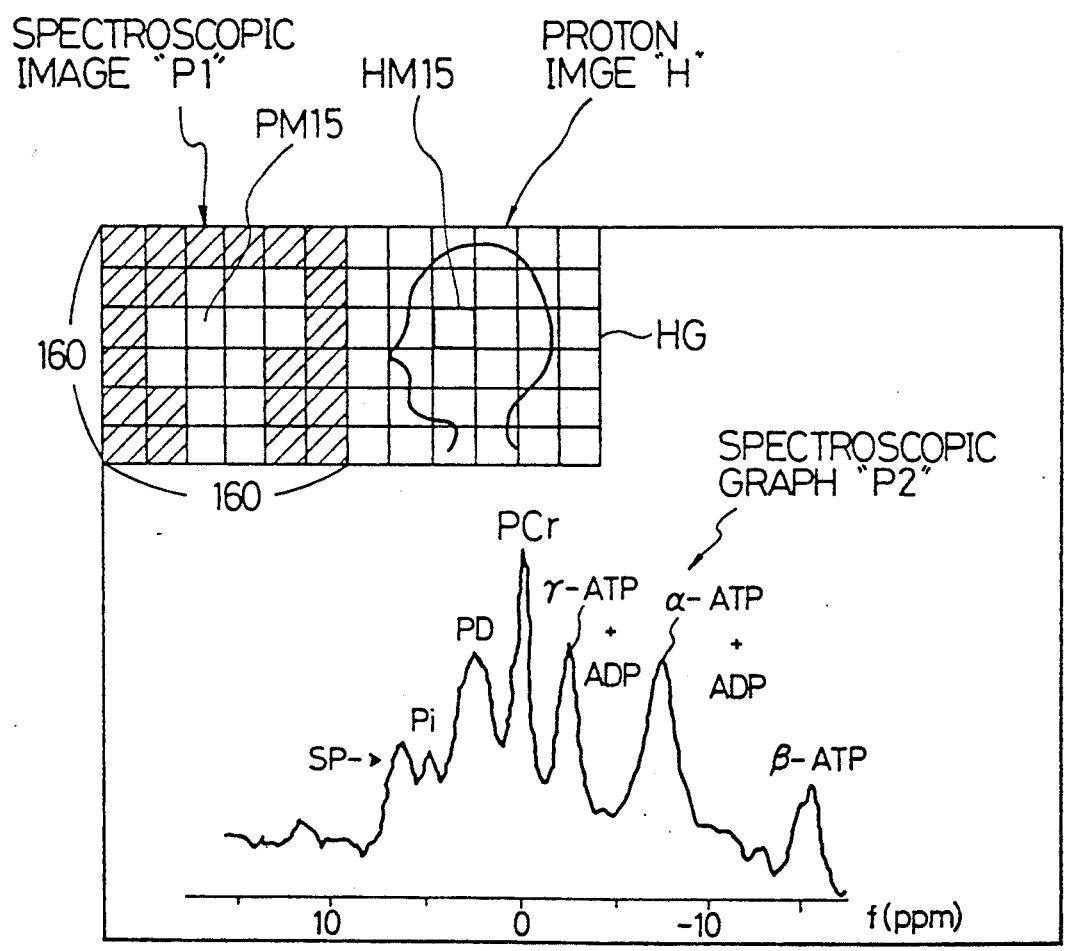
FIG. 1 illustrate a display condition of a CRT monitor in a spectroscopic imaging apparatus according to a first preferred embodiment of the invention.
Figure 2:
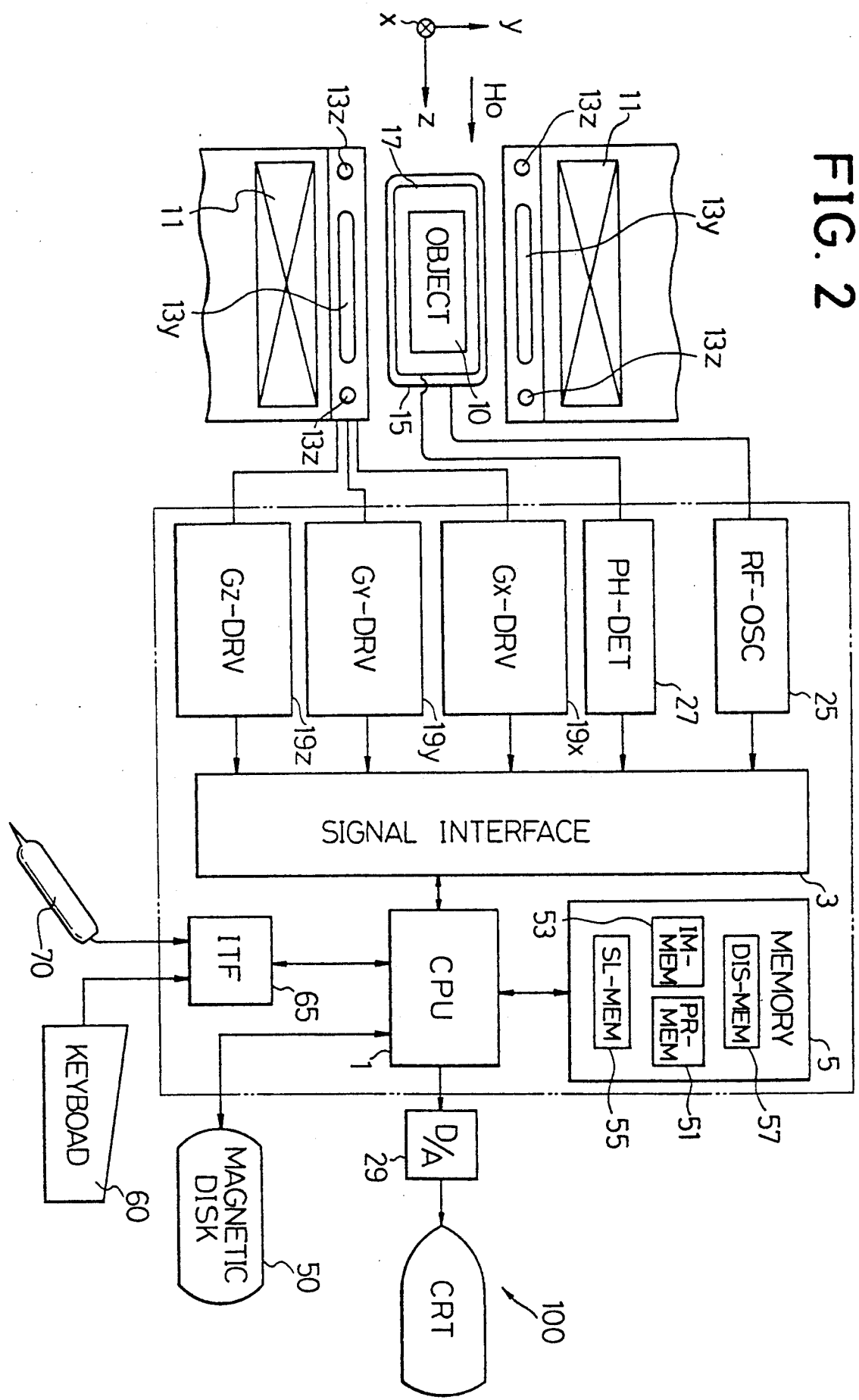
FIG. 2 is a schematic block diagram of the spectroscopic imaging apparatus shown in FIG. 1.

FIG. 1 illustrates a display of a spectroscopic imaging apparatus according to a first preferred embodiment of the invention. In this display, there are shown a spectroscopic image "$P_1$", a proton image "H" and a spectroscopic graph "$P_2$". FIG. 2 is a schematic block diagram of the spectroscopic imaging apparatus according to the first preferred embodiment.

An arrangement of the first spectroscopic imaging apparatus shown in FIG. 2 are as follows. The apparatus includes a CPU (central processing unit) 1 for controlling an overall system a light pen 70; keyboard 60; interface 65; a signal interface 3 for receiving various analog signals and processing; a memory unit 5 for storing MR (magnetic resonance) signal measurement data, image information and the like; a static magnetic field coil 11, gradient field coils 13y, and 13z for generating gradient fields in the y, and z directions (viewed in FIG. 2); and a display unit (CRT) 100. Gradient field coils in the x direction are present also but not illustrated in FIGS. 2 and 6. An RF (radio frequency) transmitting/receiving coil 15 is positioned around an object 10 under medical examination so as to acquire the proton image data, whereas an RF transmitting/receiving coil 17 is positioned between the object 10 and the RF transmitting/receiving coil 15 so as to acquire the spectroscopic imaging data. These RF transmitting/receiving coils 15 and 17 are operated in conjunction with a Gx-coil driver 19x connected to the x-direction gradient coil; a Gy-coil driver 19y connected to the y-direction gradient coil 13y; and a Gz-coil driver 19z connected to the z-direction gradient coil 13z; and furthermore an RF oscillator 25 and a phase detector 27.

The memory unit 5 temporarily stores various data transferred from an external magnetic disk 50. The memory unit 5 mainly includes a first RAM 51 for storing a program, a second RAM 53 for storing proton image data; and a third RAM 55 for storing slice data; and a fourth RAM 57 for storing display data. This program is used to display-process the proton image data which have been acquired by image information acquiring means and stored in the memory unit 5.

To display the proton image "H" on the display unit 100, the proton image data previously stored in the magnetic disk 50 are sent to the image memory 53 within the memory unit 5 and the data already sorted in the image memory 53 is rewritten by the proton image data sent from the magnetic disk 50.

It should be noted that the proton image display means is constructed of the above-described program memory 51, image memory 53, D/A (digital-to-analog) converter 29, and the display unit 100.

Although not shown in FIG. 2, the spectroscopic imaging apparatus includes a cooling unit and also a magnetic shield chamber for preventing the magnetic flux leakage, as is known in the art.

Figure 3:
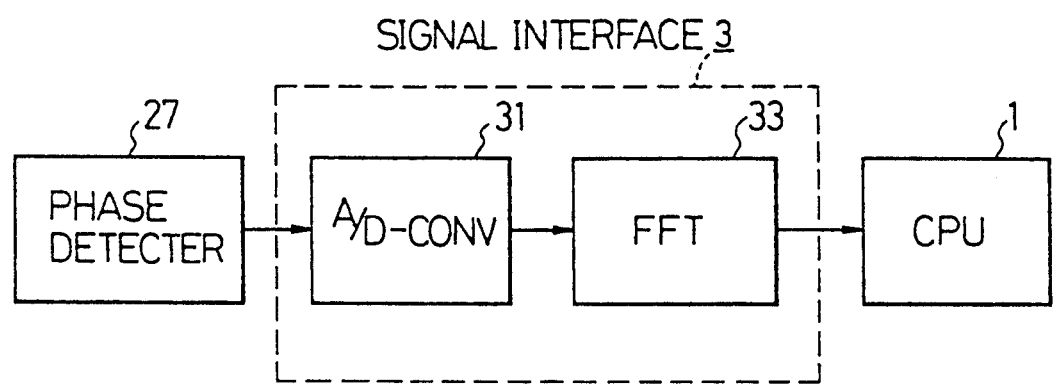
FIG. 3 is a schematic block diagram of the MR signal processing by the interface circuit shown in FIG. 1.

FIG. 3 illustrates an internal circuit of the signal interface 3 of FIG. 2. This signal interface 3 includes an A/D converter 31 and a fast Fourier transforming circuit 33.

As illustrated in FIG. 1, each of slice images, i.e., an image "$P_1$" acquired by the spectroscopic imaging is equally subdivided into 6×6 in the horizontal and vertical directions, i.e., 36 subdivided regions. Namely, one spectroscopic image "$P_1$" is equally subdivided into 36 matrix elements. The data on the spectroscopic graph for each of the matrix elements has been stored in the memory unit 5.

At this time, a grid pattern HG corresponding to the matrix form of the spectroscopic image "$P_1$" is displayed as white narrow lines on the proton image "H".

By means of this grid pattern HG, a designation on the matrix element with respect to the spectroscopic graph "$P_2$" can be readily performed.

More specifically, when an operator designates by a light pen 70, one grid region involving a portion of the object 10 to be displayed as a spectroscopic graph "$P_2$", the spectroscopic graph "$P_2$" relating to one matrix element selected from the matrix-displayed spectroscopic image "$P_1$" which corresponds to the grid region HM15 designated by the light pen 70, is displayed under the spectroscopic image "$P_1$" and proton image "H".

It should be understood that as shown in FIG. 1, an eye portion is designated by the grid region HM15 for displaying the spectroscopic graph $P_2$. According to the preferred embodiment, four edges of the grid region HM15 designated by the light pen 70 are indicated in red. Therefore, such a designation can be easily recognized. In other words, recognition can be readily and freely made that the spectroscopic graph "$P_2$" displayed on the display unit 100 represents the portion of the object 10 under examination.

DEFINITIONS

A relationship between the spectroscopic image "$P_1$", proton image "H", and spectroscopic graph "$P_2$" will now be described. First, according to the conventional method, a spectroscopic image P1 of an object 10 under examination (i.e., a head portion of a body) is displayed. This image P1 is subdivided into 6×6 matrix elements. Then, a proton image "H" is also subdivided into 36 matrix elements. Thereafter, when a desired portion (i.e., an eye portion) of the object is designated in the proton image "H" by way of the grid pattern HG, namely one matrix element of the proton image "H" corresponding to the desired portion is designated, the data relating to this matrix element is calculated so as to display a spectroscopy, i.e., spectroscopic graph "$P_2$" (frequency characteristics). That is to say, both the image "$P_1$" and "H" are two-dimensional data, whereas the graph "$P_2$" is three-dimensional data, or voxel. In the preferred embodiment, the spectroscopic graph "$P_2$" indicates the frequency distribution characteristics of phosphorus in the designated matrix element, i.e., eye portion. According to the invention, spectroscopic image "P1", proton image "H" and other images "$P_3$" and "$P_4$" are displayed in the same matrix form.

Acquisition of Spectroscopic Imaging Data

Also in the preferred embodiment, both the spectroscopic image "$P_1$" of phosphorus-31 ($^{31}P$) and spectroscopy graphic data thereof are obtained by way of the conventional Fourier transformation.

Figure 4:
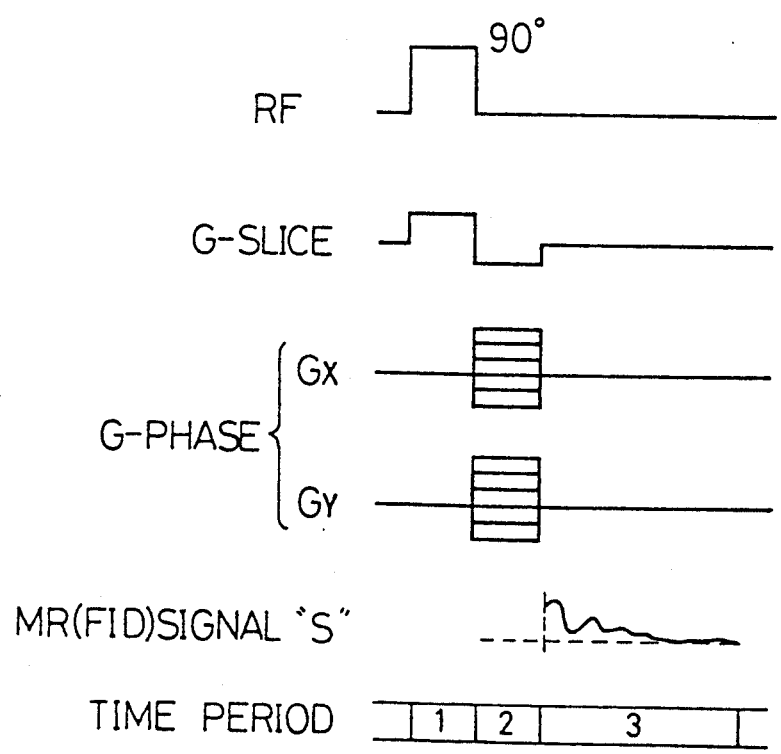
FIG. 4 is a waveform chart on the magnetic fields, and pulse sequence.

That is, the RF pulse, G-slice pulse and G-phase pulses (Gx and Gy) shown in FIG. 4 are applied to the object 10 under examination in accordance with a predetermined pulse sequence. It should be noted that the G-slice pulse applied during a first time period "1" corresponds to the z-axis direction gradient field by the slice-selecting z-axial gradient coil 13z, and the G-slice applied during a second time period "2" is to make the phases of the spins within the slice coincident with each other. Also during the second time period "2", Gx and Gy applied to the respective X-axial gradient coil 13x and y-axial gradient coil 13y are used to encode the spatial coordinate of the spin to the phase of the MR (FID) signal. As previously described, since the spectroscopic image "$P_1$" is constructed of 6×6 (36) matrix elements, the intensities of the gradient fields Gx and Gy are varied six times, respectively, and then applied to the object 10. In the subsequent time period "3", no gradient field is applied to the object 10, whereby an FID (free induction decay) signal can be detected as the MR signal.

Magnetic Resonance Signal Processing

By processing the detected MR signal based upon the following signal processing method, both the spectroscopic image "$P_1$" of phosphorus ($^{31}P$) and spectroscopy graph data can be acquired.

More specifically, the coordinate of $^{31}P$ (phosphorus-31) on the slice is represented as (x, y), when the MR signal component is expressed as $P(x1, y1, \omega) \Delta x \cdot \Delta y \cdot \Delta \omega$ based upon $^{31}P$ which is located within the region containing a point (x1, y1) of $x1 \leq x < x1+\Delta x$, $y1 \leq y < y1+\Delta y$, and the resonance frequencies of which are selected from $\omega$ to $\Delta \omega$, a summation is equal to an amount proportional to the density of $^{31}P$ at the slice point (x1, y1). Then, if P (x1, y1, $\omega$) is resented in the graph and "$\omega$" is expressed in the abscissa, the spectroscopic graph "$P_2$" relates to a partial region containing the above-described point (x1, y1). It should be noted that a summation is carried out for a discrete angular frequency in equation (1).

The MR (FID) signal s(t) detected in the third time period "3" is expressed as follows. It should be noted that the time "t" is defined as the beginning of the time period "3" being an orgin, and "$\Delta t$" represents a length of the second time period "2".

$$s(t) = \Sigma\Sigma \rho(x,y,\omega) \exp (i(\gamma(Gx \cdot x + Gy \cdot y)\Delta t + 2\pi\omega(\Delta t + t)))\Delta x \Delta y \Delta \omega \quad (2)$$

Note that a summation is performed in equation 2 with respect to a discrete angular frequency, and coordinates x and y, and symbol "$\gamma$" is magnetic rotational ratio.

As a consequence, the waveform data relating to the MR signal s(t) which has been sampled and stored in the memory unit 5 is processed by the discrete Fourier transformation, with the result that a signal "S1" for every frequency component is calculated as follows:

$$S1(\omega) = \Sigma\Sigma \rho(x,y,\omega) x \exp (i2\pi\omega\Delta t) x \exp (i\gamma(Gx \cdot x + Gy \cdot y)\Delta t)) \quad (3)$$

It should be noted that a summation is carried out in equation 3 with regard to the coordinates x and y.

Since in the above-described signal "S1", the spatial coordinates x and y have been encoded by the gradient fields Gx and Gy, the resultant data $\rho(x, y, \omega)$ is obtained by three-dimensional-Fourier-transforming this signal "S1" for the gradient fields Gx, Gy and a time domain.

The above-explained signal processing operation to obtain $\rho(x, y, \omega)$ from the MR signal s(t) is carried out in the fast Fourier transformation circuit 33 shown in FIG. 3, in accordance with the preferred embodiment.

DATA STORAGE CONDITION

Figure 8A:
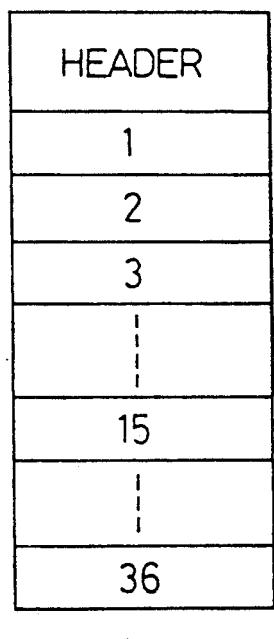
Figure 8B:
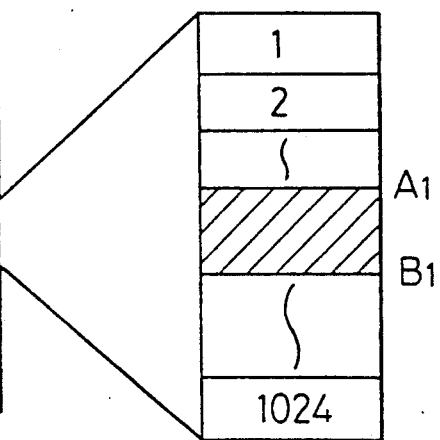

The resultant data $\rho(x, y, \omega)$ is stored in the memory unit 5 under data storage conditions as illustrated in FIGS. 8A and 8B.

In the first preferred embodiment, as shown in FIG. 8B, the spectroscopic graph data relating to the 1st to 36th matrix elements are constructed of 1024 sampling data. Each of the sampling data is expressed as 2 bytes of real parts and 2 bytes of imaginary parts, i.e., 4 bytes. As a header portion of the spectroscopic image data region for each slice, various imaging conditions such as a data of this imaging, a serial number, tilt, and slue have been recorded. Then, summation data of 1024 sampling data are stored at the final 4-byte portion of the respective spectroscopic graph data region.

Proton Image Display

Then, summation data calculated from 36 data on $\rho(x, y, \omega)$ are displayed as the spectroscopic image "$P_1$" in a grey scale. In other words, the greatest summation data value is displayed in white, whereas the smallest summation data value is displayed in black. As shown in FIG. 1, since this spectroscopic image "$P_1$" is displayed by 160×160 display pixels, 1 matrix element is enlarged by 160/6 display pixels.

To display the spectroscopic graph "$P_2$" of the matrix element designated by the grid region HM15, the data $\rho(x, y, \omega)$ relating to this matrix element are read out from the magnetic disk 50 with respect to all of the discrete frequency, and the data previously stored in the image memory 53 are rewritten by the read data.

In this case, the proton image "H" is displayed for selecting the above-described matrix element and the spectroscopic image "$P_1$" is displayed for indicating which portion of the object 10 under examination is related thereto, as illustrated in FIG. 1, according to the first preferred embodiment.

The image information acquisition to display the proton image "H" can be achieved by way of the conventional MR techniques. More specifically, an object under examination is positioned under the static magnetic field. Then, an RF pulse field having a predetermined frequency is applied to the object under the condition that the gradient field pulse is being applied thereto along the static field direction, so as to selectively excite protons within a selected slice of the object. To read out the MR (FID) signal from the object, the gradient fields are applied to the object in a direction perpendicular to the static magnetic field. Also to encode the spatial information to the phase of the MR signal, another gradient field for phase encoding purposes is applied to the object in a direction normal to both the static field and above-described reading gradient fields, whereby the FID signal is obtained and thereafter Fourier-transformed in the two dimension. That is to say, a first FFT (fast Fourier transformation) is carried out in the reading gradient-field direction, and thereafter, the resultant FFT data is furthermore processed by the FFT in the phase encode gradient direction so as to obtain the density distribution of the protons in the slice.

The above-described FFT calculation is performed in the FFT circuit 33 of the signal interface 3 shown in FIG. 3.

The acquired proton image information are once stored in the magnetic disk 50, and thereafter read therefrom and stored in the memory 55 of the memory unit 5 every slice. With respect to the storage condition of the proton image information, the imaging conditions similar to that of the spectroscopic image, e.g., the data of slice imaging, the serial number, tilt, and slue, are stored in the header portion of the data region for each slice.

As previously described, according to the preferred embodiment, based upon the proton image information acquired by the proton image information acquiring means, the proton image "H" is displayed on the same display screen beside the spectroscopic image "P1" of $^{31}P$ (phosphorus), as represented in FIG. 1. In this case, the proton image "H" is displayed within the $160 \times 160$ pixel region which is located rightside the specific pixel (0, 160) of the spectroscopic image "P1".

According to the preferred embodiment, the displayed proton image "H" functions as an image for compensating for the lower resolution of the spectroscopic image "P1" of $^{31}P$ (phosphorus). That is to say, when an operator makes a designation of the desired matrix element within the spectroscopic image by inputting from the keyboard 60 via an input interface 65 the serial number and slice number of the desired spectroscopic image "P1" to CPU 1, the data retrieve means arranged by the retrieving program stored in the memory unit 5 will detect the content of the header coincident with that of the data region of the designated spectroscopic image "P1", so as to find out the memory storage region of the proton image data which corresponds to the same object portion of the spectroscopic image "P1". The retrieved data is once stored in the memory 57 of the memory unit 5 and thereafter, the desired proton image "H" is displayed together with the spectroscopic image "P1", as shown in FIG. 1.

It should be noted that the displayed graph "P2" may be processed in the known phase correction or base line correction. In this case, since the proton image "H" has been additionally displayed together with the graph "P2" according to the preferred embodiment, there is a particular advantage that recognition can be readily performed which portion of the object 10 is under the above-explained graphic data process.

Arrangement of Second Spectroscopic Imaging Apparatus

A description will now be made to a spectroscopic imaging apparatus according to a second preferred embodiment of the invention.

Figure 5:
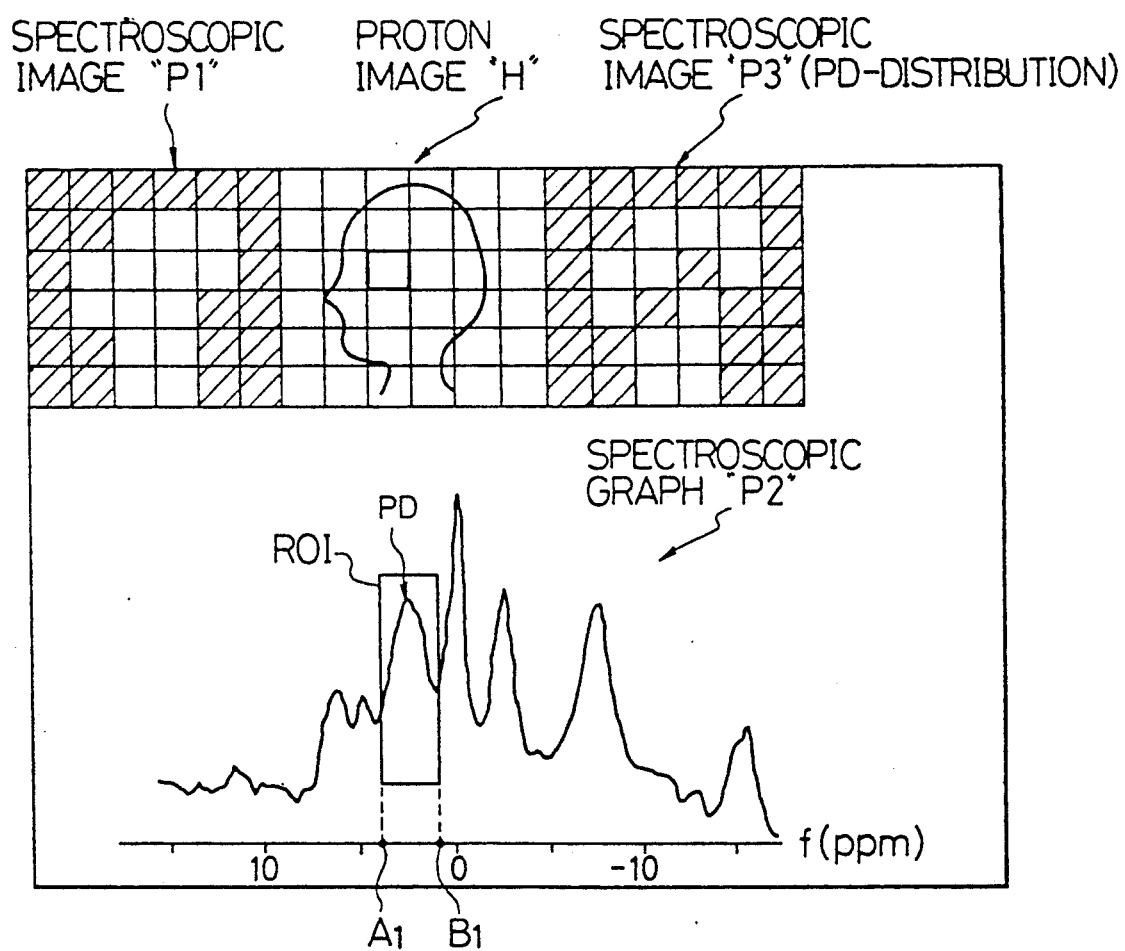
FIG. 5 represents a display condition of a CRT monitor in a spectroscopic imaging apparatus according to a second preferred embodiment of the invention shown in FIG. 1.
Figure 6:
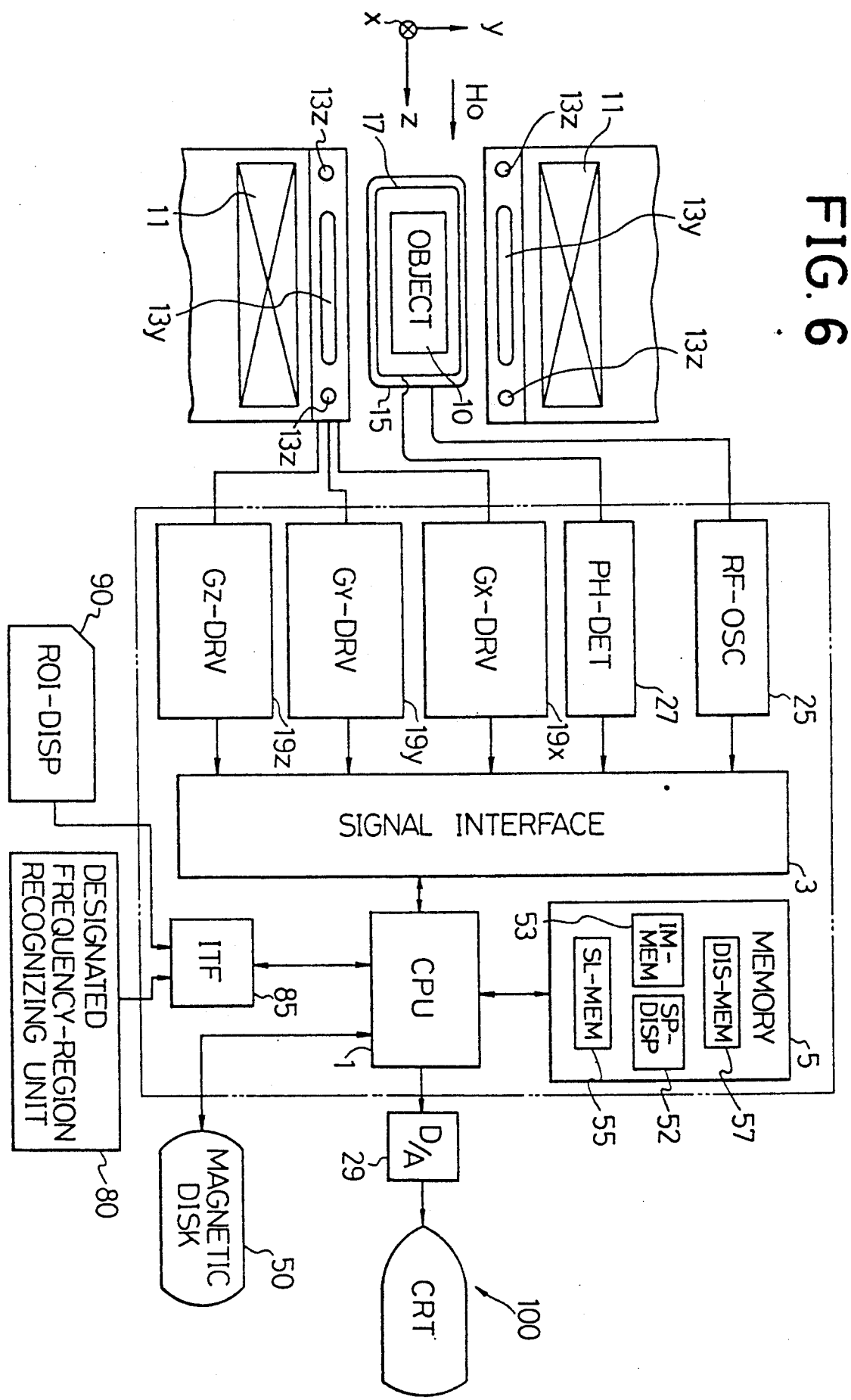
FIG. 6 is a schematic block diagram of the spectroscopic imaging apparatus shown in FIG. 5.

FIG. 5 is a display condition by the spectroscopic imaging apparatus of the second preferred embodiment. FIG. 6 is a schematic block diagram of the second spectroscopic imaging apparatus.

As the display condition of FIG. 5, another spectroscopic image "P3" (i.e., PD distribution information) is displayed in addition to that of FIG. 1.

As apparent from FIG. 6, the major circuit of the spectroscopic imaging apparatus according to the second preferred embodiment is the same as that of the first preferred embodiment shown in FIG. 2. That is, the spectroscopic imaging apparatus shown in FIG. 6 includes the static field generating coil 11, slicing gradient field generating coil 13z, phase-encoding gradient field coils 13x, in the x and y directions, RF transmitting-/receiving coils 15, 17 and so on. This imaging apparatus further includes a designated frequency-region recognizing means 80, interface 85 and an integration means for a spectroscopic graph within a designated frequency region. This integration means is constructed of CPU 1 and an integration program stored in the memory unit 5.

Also, the spectroscopic imaging apparatus furthermore includes a ROI (region of interest) display means 90 which constitutes a frequency-region designating means in conjunction with the above-described recognizing means 80 for the designated frequency region.

Both the RF transmitting/receiving coils 15 and 17 as the normal spectroscopic image data acquiring means and the spectroscopic graph integrating means constitute an acquiring means for the spectroscopic image information of the designated frequency region.

Although, in principle, this imaging apparatus has the same proton image display means as that of FIG. 2, a display means 52 for a designated frequency-region spectroscopic image is employed instead of the previous program memory 51 shown in FIG. 2, in which a program for defining a display process of the designated frequency-region spectroscopic image is stored.

As previously described, there is shown the image display condition of the spectroscopic imaging apparatus in FIG. 5. In accordance with the second preferred embodiment, the spectroscopic image "P3" of the designated frequency region is newly displayed on the same display screen in addition to the spectroscopic image "P1" of $^{31}P$ (phosphorus-31), proton image "H" and spectroscopic graph "P2". This image P3 is displayed in the grey scale by summing the spectroscopic data within the frequency region designated by way of the ROI display means 90n and integrating means for the spectroscopic graph within the designated frequency region, as the integration of the spectroscopic graph within the designated frequency region with respect to the respective matrix elements.

Display of Designated Frequency Region's Image "P3"

A display of this featured spectroscopic image "P3" of the designated frequency region is achieved as follows.

As illustrated in FIGS. 5 and 6, an operator designates the frequency region in question by the ROI display means 90 on the display screen 100 by way of a rectangular-shaped ROI the position and size of which are freely settable. Then, the designated frequency-region recognizing unit 80 will recognize a lower limit discrete frequency "$A_1$" (see FIG. 5) and an upper limit discrete frequency $B_1$ (see also FIG. 5), and send the resultant data to CPU 1. CPU 1 calculates a summation of the spectroscopic data within this designated frequency region $A_1$ or $B_1$ with respect to the respective matrix elements in accordance with the above-described integration program of the memory 52 in response to the input data. In FIG. 8B, there are shown relationships between the designated frequency region $A_1$ or $B_1$, and the spectroscopic data of the 15th matrix element to be summarized. The spectroscopic data region to be summarized are displayed by the inclined line in FIG. 8B.

As previously described, in accordance with the second preferred embodiment, a summation on the spectroscopic image data within the designated frequency-region with respect to the respective matrix elements is calculated. Based upon the grey scale corresponding to the summation values, the desired spectroscopic image "$P_3$" within the designated frequency region is displayed.

Thus, the displayed spectroscopic image "$P_3$" within the designated frequency region represents distribution information of the specific compound containing $^{31}P$ (phosphorus), i.e., phosphodiestel (PD) in FIG. 5.

According to the second preferred embodiment, there is a particular advantage that the spectroscopic image "$P_3$" of the designated frequency region can provide complementary information to the conventional spectroscopic image "$P_1$" of $^{31}P$ (phosphorus-31) which merely represents as a whole the distribution condition of $^{31}P$.

Also, according to the second preferred embodiment, the proton image "H" is simultaneously displayed in conjunction with the images "$P_1$" and "$P_3$", which can similarly provide the same effect as in the first preferred embodiment.

It is, of course, obvious that since the spectroscopic image "$P_3$" owns the specific advantage, the more detailed physiological information can be represented than in the spectroscopic image "$P_1$", even if no proton image H is displayed.

Figure 7:
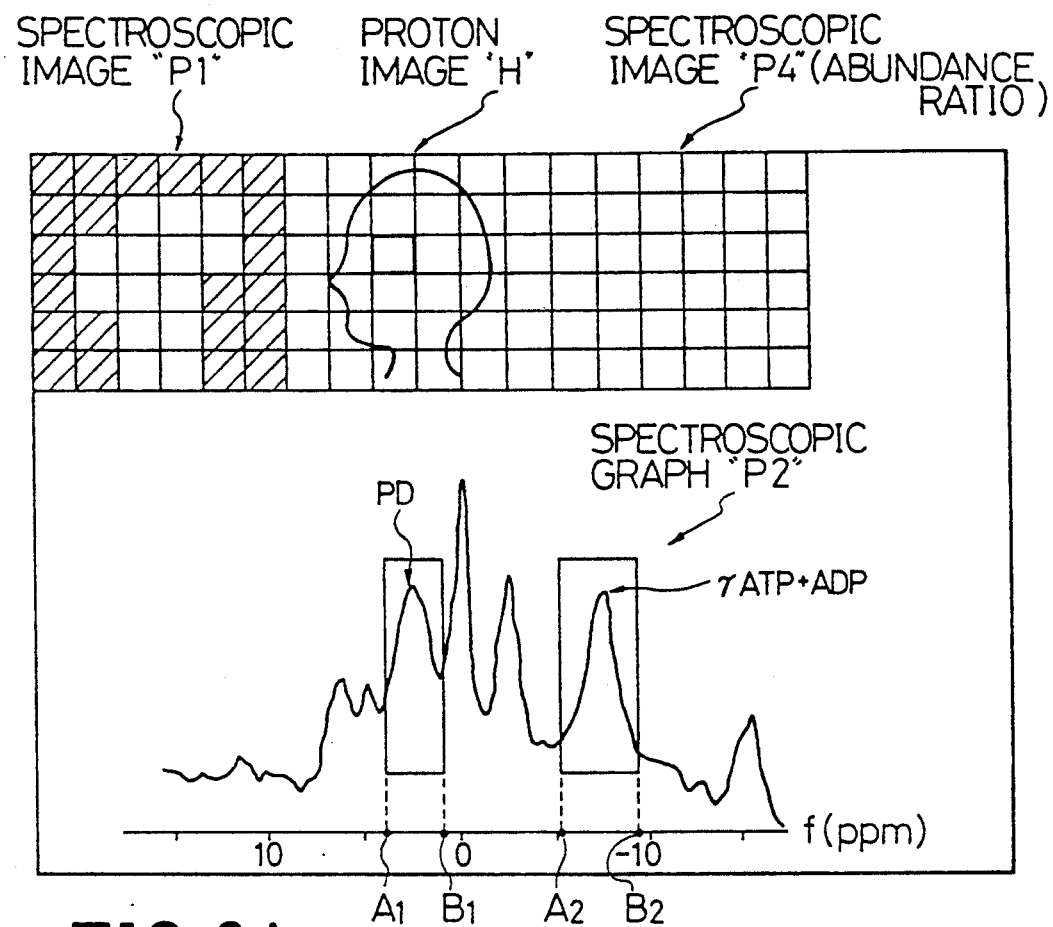
FIG. 7 indicates another display condition of the CRT monitor of the spectroscopic imaging apparatus shown in FIG. 6; and, FIG. 8A and 8B illustrate data storage conditions of the imaging apparatus shown in FIG. 2 and 6.

Furthermore, as shown in FIG. 7, in accordance with the preferred embodiment, two different frequency regions $A_1$ to $B_1$ and $A_2$ to $B_2$ are designated by two different ROIs. A first summation "$\Sigma_1$" on the spectroscopic image data within the first designated frequency region $A_1$ to $B_1$ and a second summation "$\Sigma_2$" on the spectroscopic image data within the second designated frequency region $A_1$ to $B_2$ are calculated. A ratio of $\Sigma_1$ to $\Sigma_2$ is displayed as a spectroscopic image "$P_4$" of the designated frequency region in the grey scale. In FIG. 7, the information relating to an abundance (presence) ratio between phosphodiester and ($\gamma$-ATP-ADP) is displayed as the spectroscopic image "$P_4$".

As is obvious from the foregoing, this ratio is not limited to the above example, but may be selected to other combinations, which can provide the more detailed physiological information than that of the conventional spectroscopic image "$P_1$".

MODIFICATIONS

The present invention is not limited to the above-described preferred embodiments, but may be readily modified without departing from the technical scope of the invention.

For instance, any elements other than $^{31}P$, e.g., $^{23}Na$ and $^{13}C$ may be employed for the spectroscopic imaging process. Instead of the above-described two-dimensional Fourier transforming method, the known SIDAC (Spectroscopic Imaging by Dephasing Amplitude Changing) method, CIDRE (Chemical shift Imaging using Double phase Refocused Echoes) method, and Sepponen et al. method may be utilized as the spectroscopic imaging method.

While it has been described in detail, the spectroscopic imaging apparatus according to the invention has the following particular advantages. That is, since the additional images are simultaneously displayed with the spectroscopic image "$P_1$" for the complementary purposes, the conventional problems such as the lower resolution, or a shortage of display information of the spectroscopic image "$P_1$" can be solved.

For instance, if the proton image "H" is displayed as the complementary image for the spectroscopic image "$P_1$", a clear definition can be made which portion of the object under examination is displayed as a part of the presently displayed spectroscopic image. Moreover, a correct designation can be readily made of the matrix element corresponding to the spectroscopic graph by way of the proton image.

When the spectroscopic image "$P_3$" of the designated frequency region is displayed as the auxiliary image for the spectroscopic image "$P_1$", a detailed presence condition of a specific nuclear species may be represented as compared with the spectroscopic image, so that various information obtained by the MR measurement may be efficiently utilized.

What is claimed is:

1. A spectroscopic imaging apparatus utilizing a magnetic resonance phenomenon, comprising:
    means for acquiring spectroscopic imaging data of a nuclear species within a selected portion of a tissue of a biological object under medical examination so as to obtain a spectroscopic image;
    means for acquiring spectroscopic graphic data of the selected portion of the tissue, said graphic data representative of a ratio of the nuclear species to a compound present in said selected portion of the tissue so as to obtain a spectroscopic graph;
    means for acquiring auxiliary image data corresponding to the spectroscopic imaging data in order to obtain an auxiliary image; and
    means for displaying the spectroscopic image and auxiliary image in a same matrix form, and for displaying said spectroscopic graph.

2. A spectroscopic imaging apparatus as claimed in claim 1, wherein said spectroscopic image represents a distribution condition of said nuclear species over a selected slice region of said biological object.

3. A spectroscopic imaging apparatus as claimed in claim 1, wherein said means for acquiring the spectroscopic graphic data includes means for calculating chemical shifts of nuclear species.

4. A spectroscopic imaging apparatus as claimed in claim 1, wherein said auxiliary image is a proton image and wherein said auxiliary imaging data acquiring means includes:
    means for acquiring proton imaging data; and
    means for displaying said proton image.

5. A spectroscopic imaging apparatus as claimed in claim 4, wherein said proton imaging data acquiring means includes:
    an RF (radio frequency) pulse generator;
    an RF pulse transmitting/receiving unit;
    a magnetic field producing unit;
    a phase detector for detecting magnetic resonance signals of protons produced under application of RF pulses and magnetic fields so as to obtain phase-detected magnetic resonance signals of said protons; and
    a fast Fourier transform means for Fourier-transforming said phase-detected magnetic resonance signals of said protons so as to obtain a density distribution of said protons over the tissue.

6. A spectroscopic imaging apparatus as claimed in claim 5, wherein said magnetic resonance signal is an FID (free induction decay) signal.

7. A spectroscopic imaging apparatus as claimed in claim 1, further comprising:
means for designating a matrix element within said matrix form of said auxiliary image.

8. A spectroscopic imaging apparatus as claimed in claim 1, wherein said nuclear species is selected from a group consisting of $^{31}P$ (phosphorus-31), $^{23}Na$ (natrium-23) and $^{13}C$ (carbon-13).

9. A spectroscopic imaging apparatus utilizing a magnetic resonance phenomenon, comprising:
means for acquiring spectroscopic imaging data of a nuclear species within a selected portion of a tissue of a biological object under medical examination so as to obtain a spectroscopic image;
means for acquiring spectroscopic graphic data representative of the selected portion of the tissue, said graphic data representative of a ratio of the nuclear species to a compound present in said selected portion of the tissue so as to obtain a spectroscopic graph;
means for designating a frequency region in said spectroscopic graph;
means for integrating a plurality of spectroscopic graphic data within the designated frequency region so as to obtain a distribution image of the nuclear species; and
means for displaying the spectroscopic image, and the distribution image in a same matrix form, and for displaying the spectroscopic graph.

10. A spectroscopic imaging apparatus as claimed in claim 9 further comprising:
means for acquiring auxiliary image data relating to the spectroscopic imaging data in order to obtain an auxiliary image, whereby said auxiliary image is displayed in conjunction with said spectroscopic image and said distribution image in the same matrix form, and also with said spectroscopic graph.

11. A spectroscopic imaging apparatus as claimed in claim 9, wherein said spectroscopic image represents a distribution condition of said nuclear species over the selected portion of said biological object.

12. A spectroscopic imaging apparatus as claimed in claim 9, wherein said means for acquiring the spectroscopic graphic data includes means for calculating chemical shifts of nuclear species.

13. A spectroscopic imaging apparatus as claimed in claim 12, wherein said auxiliary image is a proton image and wherein said auxiliary imaging data acquiring means includes:
means for acquiring proton imaging data; and
means for displaying said proton image.

14. A spectroscopic imaging apparatus as claimed in claim 13, wherein said proton imaging data acquiring means includes:
an RF (radio frequency) pulse generator;
an RF pulse transmitting/receiving unit;
a magnetic field producing unit;
a phase detector for detecting magnetic resonance signals of protons produced under application of RF pulses and magnetic fields so as to obtain phase-detected magnetic resonance signals of said protons; and
a fast Fourier transform means for Fourier-transforming said phase-detected magnetic resonance signals of said protons so as to obtain a density distribution of said protons over the tissue.

15. A spectroscopic imaging apparatus as claimed in claim 14, wherein said magnetic resonance signal is an FID (free induction decay) signal.

16. A spectroscopic imaging apparatus as claimed in claim 9, further comprising:
means for designating a matrix element within said matrix form of said auxiliary image.

17. A spectroscopic imaging apparatus as claimed in claim 9, wherein said nuclear species is selected from a group consisting of $^{31}P$ (phosphorus-31), $^{23}Na$ (natrium-23) and $^{13}C$ (carbon-13).

18. A spectroscopic imaging apparatus utilizing a magnetic resonance phenomenon, comprising:
means for acquiring spectroscopic imaging data of a nuclear species within a selected portion of a tissue of a biological object under medical examination so as to obtain a spectroscopic image;
means for acquiring spectroscopic graphic data of the selected portion of the tissue, said graphic data representative of a ratio of the nuclear species to a compound present in said selected portion of the tissue so as to obtain a spectroscopic graph;
means for designating at least first and second frequency regions in said spectroscopic graph;
means for integrating a plurality of the spectroscopic graphic data within the first and second designated frequency regions to obtain first and second integrated spectroscopic graphic data;
means for calculating a ratio between the first and second integrated spectroscopic graphic data to obtain a ratio distribution of the plural nuclear species within the designated first and second frequency regions; and
means for displaying the spectroscopic image and a ratio distribution image produced from the ratio distribution of the plural nuclear species in a same matrix form, and for displaying the spectroscopic graph.

19. A spectroscopic imaging apparatus as claimed in claim 18, further comprising:
means for acquiring auxiliary image data relating to the spectroscopic imaging data in order to obtain an auxiliary image, and wherein said display means includes means for displaying said auxiliary image in conjunction with said spectroscopic image, and said ratio distribution image in the same matrix form.

20. A spectroscopic imaging apparatus as claimed in claim 19, wherein said auxiliary image is a proton image of the tissue of the biological object, and said nuclear species is phosphorus-31.

* * * * *